US011087699B1

(12) United States Patent
Noh et al.

(10) Patent No.: US 11,087,699 B1
(45) Date of Patent: Aug. 10, 2021

(54) DISPLAY DEVICE

(71) Applicant: Samsung Display Co., Ltd., Yongin-Si (KR)

(72) Inventors: Deok Jun Noh, Asan-si (KR); Do-Hoon Kim, Asan-si (KR); Cheon Deok Park, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/942,672

(22) Filed: Jul. 29, 2020

(30) Foreign Application Priority Data

Feb. 3, 2020 (KR) .......................... 10-2020-0012578

(51) Int. Cl.
*G09G 3/3291* (2016.01)
*G09G 3/3266* (2016.01)
*H01L 27/32* (2006.01)
*H01L 51/52* (2006.01)

(52) U.S. Cl.
CPC ......... *G09G 3/3291* (2013.01); *G09G 3/3266* (2013.01); *H01L 27/323* (2013.01); *H01L 27/3276* (2013.01); *H01L 51/5246* (2013.01)

(58) Field of Classification Search
CPC ............ H01L 27/3276; H01L 27/3297; G09G 3/3291; G09G 3/3266
See application file for complete search history.

(56) References Cited

U.S. PATENT DOCUMENTS

| 9,397,150 | B2* | 7/2016 | Kim | .......................... H01L 51/56 |
| 10,679,567 | B2* | 6/2020 | Lee | ........................ G09G 3/3291 |
| 10,706,753 | B2* | 7/2020 | Lee | ........................ G02F 1/13452 |
| 10,804,353 | B2* | 10/2020 | Choi | .................... G09G 3/3291 |
| 10,957,757 | B2* | 3/2021 | Youn | .................. H01L 27/3276 |

FOREIGN PATENT DOCUMENTS

| JP | 4947510 B2 | 6/2012 |
| KR | 10-0545021 B1 | 1/2006 |
| KR | 10-0639005 B1 | 10/2006 |
| KR | 10-0824531 B1 | 4/2008 |
| KR | 10-2015-0081813 A | 7/2015 |

* cited by examiner

*Primary Examiner* — Sardis F Azongha
(74) *Attorney, Agent, or Firm* — Innovation Counsel LLP

(57) ABSTRACT

A display device includes a first substrate, a driving voltage line, a common voltage line, a dam, a second substrate, and a sealant. The driving voltage transfer line is disposed on the first substrate and may transfer a driving voltage. The common voltage transfer line is disposed on the first substrate and may transfer a common voltage. The dam is disposed between the driving voltage transfer line and the common voltage transfer line, is electrically isolated from at least one of the driving voltage transfer line and the common voltage line, and is disposed on the first substrate. The second substrate overlaps the first substrate. The sealant is disposed between the first substrate and the second substrate and overlaps each of the driving voltage transfer line, the common voltage transfer line, and the dam.

20 Claims, 12 Drawing Sheets

DISPLAY DEVICE

CROSS-REFERENCE TO RELATED APPLICATION

This application claims priority to Korean Patent Application No. 10-2020-0012578, filed in the Korean Intellectual Property Office on Feb. 3, 2020; the Korean Patent Application is incorporated herein by reference.

BACKGROUND (a) Technical Field

This technical field relates to a display device.

(b) Description of the Related Art

A display device may include light emitting elements, wires for transmitting signals to the light emitting elements, and a sealing structure for protecting the light emitting elements from moisture and/or oxygen. The sealing structure may overlap the wires.

In a process of forming the sealing structure, heat may be provided to sealing material that overlaps the wires. The heat may undesirably affect the wires.

SUMMARY

Embodiments may prevent damage or defects potentially caused by heat provided during a sealing process of a display panel.

A display device according to an embodiment includes the following elements: a first substrate; a driving voltage transfer line disposed on the first substrate to transfer a driving voltage; a common voltage transfer line disposed on the first substrate to transfer a common voltage; a dam disposed between the driving voltage transfer line and the common voltage transfer line on the first substrate; a second substrate facing the first substrate; and a sealant disposed between the first substrate and the second substrate to overlap the driving voltage transfer line, the common voltage transfer line, and the dam.

The driving voltage transfer line, the common voltage transfer line, and the dam may be made of a same material.

The display device may further include an insulating layer disposed on the first substrate, and the driving voltage transfer line and the dam are in contact with the insulating layer.

The dam may contact the sealant.

The display device may further include a pad area disposed on the first substrate, the driving voltage transfer line may include an elongated part extending parallel to the pad area, and the dam may extend parallel to the extension.

The dam may include at least one dam member having a line shape in a plan view.

The dam may include at least one dam member having a W shape in a plan view.

The dam may include a plurality of dam members that are discontinuous in a direction in which the dam extends.

The dam may include a plurality of dam members arranged in a diagonal direction with respect to a direction in which the dam extends.

The dam may include a plurality of dam members having a shape of square brackets.

A display device according to an embodiment includes the following elements: a first substrate configured to include a display area and a non-display area; a first voltage transfer line disposed on the non-display area to transfer a first voltage; a second voltage transfer line disposed on the non-display area to transfer a second voltage having a different level from that of the first voltage; a dam disposed between the first voltage transfer line and the second voltage transfer line; a second substrate bonded to the first substrate; and a sealant disposed between the first substrate and the second substrate to surround the display area while overlapping the first voltage transfer line, the second voltage transfer line, and the dam.

The first voltage transfer line, the second voltage transfer line, and the dam may be made of a same material.

The display area may further include: a pixel disposed in the display area; a scan line extending in a first direction and applying a scan signal to the pixel; a data line extending in a second direction crossing the first direction and applying a data voltage to the pixel; and a driving voltage line extending in the second direction and applying a driving voltage to the pixel. One of the first voltage transfer line and the second voltage transfer line may be electrically connected to the driving voltage line.

The display device may further include an insulating layer disposed on the first substrate, and the driving voltage transfer line, the common voltage transfer line, and the dam may contact the insulating layer and the sealant.

The first voltage transfer line may transfer a driving voltage, and the second voltage transfer line may transfer a common voltage. The first voltage transfer line may include a portion extending in the first direction, and the dam may extend parallel to the portion of the first voltage transfer line.

The dam may include at least one dam member having a line shape in a plan view.

The dam may include at least one dam member having a W shape in a plan view.

The dam may include a plurality of dam members that are discontinuous in a direction in which the dam extends.

The dam may include a plurality of dam members arranged in a diagonal direction with respect to a direction in which the dam extends.

The dam may include a plurality of dam members having a shape of square brackets.

An embodiment may be related to a display device. The display device may include a first substrate, a driving voltage line, a common voltage line, a dam, a second substrate, and a sealant. The driving voltage transfer line may be disposed on the first substrate and may transfer a driving voltage. The common voltage transfer line may be disposed on the first substrate and may transfer a common voltage. The dam may be disposed between the driving voltage transfer line and the common voltage transfer line, may be electrically isolated from at least one of the driving voltage transfer line and the common voltage line, and may be disposed on the first substrate. The second substrate may overlap the first substrate. The sealant may be disposed between the first substrate and the second substrate and may overlap each of the driving voltage transfer line, the common voltage transfer line, and the dam.

The sealant may be directly connected to at least one of the first substrate and the second substrate.

The driving voltage transfer line, the common voltage transfer line, and the dam may be made of a same material.

The display device may include an insulating layer disposed on the first substrate. Each of the driving voltage transfer line, the common voltage transfer line, and the dam may directly contact the insulating layer.

The dam may directly contact the sealant.

The driving voltage transfer line may include an elongated part extending parallel to each of the dam and an edge of the sealant in a plan view of the display device.

The dam may include at least one dam member having a linear structure in a plan view of the display device.

The dam may include a W-shaped structure in a plan view of the display device.

The dam may include dam members that are spaced from each other in a lengthwise direction of the driving voltage transfer line.

The dam may include dam members that are spaced from each other in an extension direction of an edge of the driving voltage transfer line.

The dam may be positioned between an edge of the driving voltage transfer line and an edge of the common voltage transfer line. The dam may include dam members that are spaced from each other. Each of the dam members may be oriented oblique with respect to the edge of the driving voltage transfer line in a plan view of the display device.

The dam may include dam members that are spaced from each other. Each of the dam members may have a shape of a square bracket in a plan view of the display device.

An embodiment may be related to a display device. The display device may include the following elements: a first substrate including a display area and a non-display area; a first voltage transfer line disposed on the non-display area and configured to transfer a first voltage having a first voltage level; a second voltage transfer line disposed on the non-display area and configured to transfer a second voltage having a second voltage level unequal to the first voltage level; a dam disposed between the first voltage transfer line and the second voltage transfer line and electrically isolated from at least one of the first voltage transfer line and the second voltage line; a second substrate overlapping the first substrate; and a sealant disposed between the first substrate and the second substrate, surrounding the display area in a plan view of the display device, and overlapping each of the first voltage transfer line, the second voltage transfer line, and the dam.

The sealant may directly contact at least one of the first substrate and the second substrate.

The first voltage transfer line, the second voltage transfer line, and the dam may be made of a same material.

The display device may include the following elements: a pixel disposed on the first substrate and disposed in the display area; a scan line extending in a first direction and configured for applying a scan signal to the pixel; a data line extending in a second direction and configured for applying a data voltage to the pixel, wherein the second direction may be different from the first direction; and a driving voltage line extending in the second direction and configured for applying a driving voltage to the pixel. One of the first voltage transfer line and the second voltage transfer line may be electrically connected to the driving voltage line.

The display device may include an insulating layer disposed on the first substrate. Each of the first voltage transfer line and the dam may directly contact each of the insulating layer and the sealant.

The first voltage transfer line may transfer a driving voltage. The second voltage transfer line may transfer a common voltage. An edge of the first voltage transfer line may extend in the first direction. A lengthwise direction of the dam may be in the first direction.

The dam may include at least one linear dam member in a plan view of the display device.

The dam may include a W-shaped structure in a plan view of the display device.

The dam may be positioned between an edge of the first voltage transfer line and an edge of the second voltage transfer line. The dam may include dam members that are spaced from each other in an extension direction of the edge of the first voltage transfer line.

The dam may be positioned between an edge of the first voltage transfer line and an edge of the second voltage transfer line. The dam may include dam members that are spaced from each other. Each of the dam members may be oriented oblique with respect to the edge of the first voltage transfer line.

The dam may include dam members that are spaced from each other. Each of the dam members may have a shape of a square bracket in a plan view of the display device.

BRIEF DESCRIPTION OF THE DRAWINGS

Each of FIG. 6, FIG. 7, FIG. 8.

DETAILED DESCRIPTION OF THE EMBODIMENTS

Figure 1:
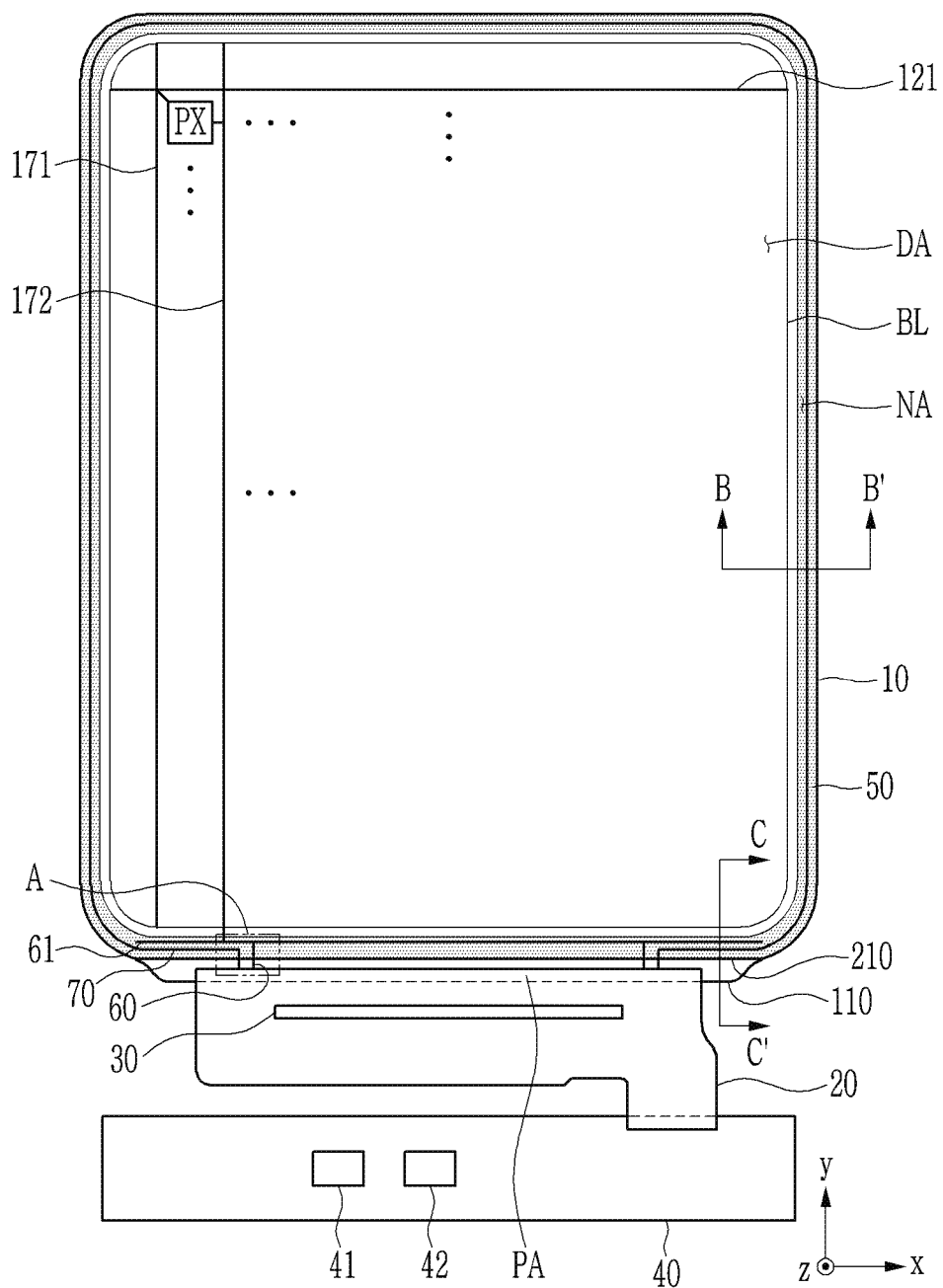
FIG. 1 schematically illustrates (a plan view of) a display device according to an embodiment.

Embodiments are described with reference to the accompanying drawings. The described embodiments may be modified in various ways.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

In the drawings, for better understanding and ease of description, dimensions may be exaggerated.

When a first element is referred to as being "on" a second element, the first element can be directly on the second element, or one or more intervening elements may be present between the first element and the second element. When a first element is referred to as being "directly on" a second element, no intervening elements (except environmental elements such as air) may be intended or required between the first element and the second element.

Unless explicitly described to the contrary, the word "comprise" and variations such as "comprises" or "comprising" may imply inclusion of stated elements but may not require exclusion of any other elements.

In the drawings, a reference character "x" is used for indicating a first direction, "y" is used for indicating a second direction that is perpendicular to the first direction, and "z" is used for indicating a third direction that is perpendicular to each of the first direction and the second direction. The first direction x, the second direction y, and the third direction z may respectively correspond to a horizontal direction, a vertical direction, and a thickness direction of the display device.

Unless otherwise described in the specification, "overlapping" may indicate overlapping in the third direction z. The term "connect" may mean "electrically connect." The term "insulate" may mean "electrically insulate." The term "dam" may mean "dam set" or "dam structure." The term "contact" may mean "directly contact" or "direct contact." A list of examples/items may mean at least one of the examples/items.

Figure 2:
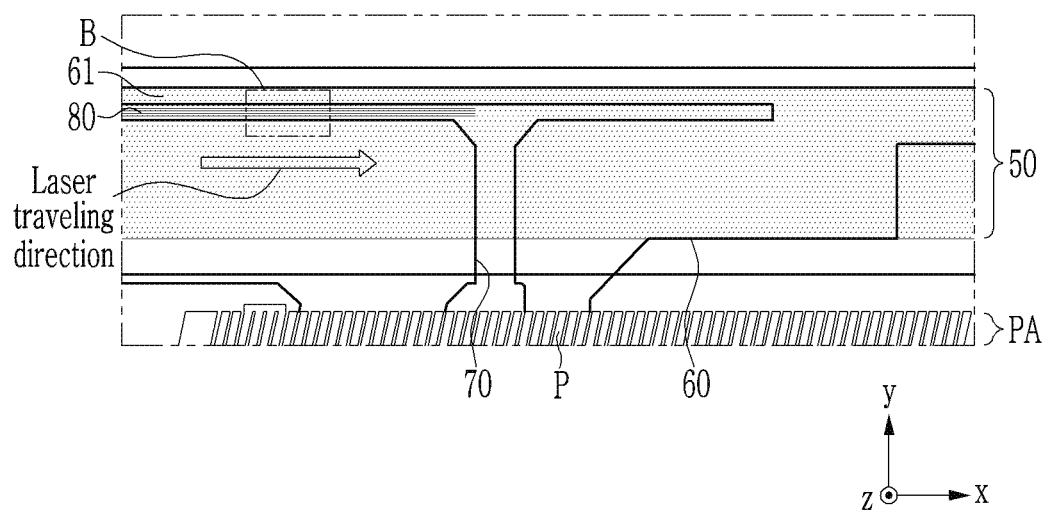
FIG. 2 illustrates a plan view of a region A shown in FIG. 1 according to an embodiment.

FIG. 1 schematically illustrates a display device according to an embodiment, and FIG. 2 illustrates a plan view of a region A shown in FIG. 1.

Referring to FIG. 1 and FIG. 2, the display device includes a display panel 10, a flexible printed circuit film 20 bonded to the display panel 10, a driving unit including an integrated circuit chip 30, etc.

The display panel 10 includes a display area DA for displaying images according to input signals and includes a non-display area NA abutting the display area DA. Circuits and/or signal lines for providing signals and voltages to the display area DA are disposed in the non-display area NA. The non-display area NA may surround the display area DA. In FIG. 1, a boundary line BL is positioned between the display area DA and the non-display area NA.

In the display area DA, pixels PX may be disposed in a matrix form on a first substrate 110. Signal lines such as scan lines 121, data lines 171, and driving voltage lines 172 may also be disposed on the first substrate 110 in the display area DA. The scan lines 121 may extend in a first direction x, and the data lines 171 and the driving voltage lines 172 may extend in a second direction y. Each of the pixels PX may be connected to corresponding ones of the signal lines (such as a scan line 121, a data line 171, and a driving voltage line 172) to receive a scan signal, a data voltage, a driving voltage.

A touch sensor for detecting a user's touch and/or a non-contact touch/input may be disposed in the display area DA. The touch sensor may be disposed on a second substrate 210. Although the display area DA having a substantially rectangular shape is illustrated, the display area DA may have one or more of various shapes, such as a polygonal shape, a circular shape, and an elliptical shape.

A pad area PA may include pads for receiving signals from an external source and may be disposed in the non-display area NA of the display panel 10. The pad area PA may extend in the first direction x along one edge of the display panel 10. A flexible printed circuit film 20 is bonded to the pad area PA, and pads of the flexible printed circuit film 20 may be electrically connected to the pads of the pad area PA. The first substrate 110 may be longer than the second substrate 210 in at least the pad area PA, such that the pad area PA may be exposed for bonding to the flexible printed circuit film 20.

The flexible printed circuit film 20 may be connected to a printed circuit board 40, which supports a processor 41, a memory 42, etc. The processor 41 may be an application processor AP including a central processing unit (CPU), a graphics processing unit (GPU), a modem, and the like. The display panel 10 may receive image data, signals related to the image data, and power through the flexible printed circuit film 20.

A driving voltage transfer line 60 for transferring a driving voltage ELVDD to the pixels PX and a common voltage transfer line 70 for transferring a common voltage ELVSS to the pixels PX are substantially disposed in the non-display area NA. The driving voltage ELVDD and the common voltage ELVSS are power voltages applied to the pixels PX. The common voltage ELVSS may be lower than the driving voltage ELVDD. For example, the driving voltage ELVDD may be a positive voltage and the common voltage ELVSS may be a negative voltage. The driving voltage transfer line 60 may receive a driving voltage of a predetermined level through at least one pad P disposed in the pad area PA and may apply the driving voltage to the driving voltage lines 172 positioned in the display area DA. The common voltage transfer line 70 may receive a common voltage of a predetermined level through at least one pad P disposed in the pad area PA and may applies the common voltage to the common electrodes of the pixels PX disposed in the display area DA.

The driving voltage transfer line 60 may be electrically connected to pads P at opposite sides/ends of the pad area PA (which may be opposite in the x direction). The driving voltage transfer line 60 may include an elongated part 61 extending in the first direction x between the pad area PA and the display area DA. The driving voltage lines 172 of the display area DA may be electrically connected to the elongated part 61 of the driving voltage transfer line 60. For example, the driving voltage lines 172 may extend from the elongated part 61 in the second direction y. The driving voltage transfer line 60 may be substantially symmetrical with reference a (geometric) centerline of the display panel 10 that extends in the second direction y.

The common voltage transfer line 70 may be electrically connected to pads P at opposite sides/ends of the pad area PA (which may be opposite in the x direction). The common voltage transfer line 70 may surround at least a portion of the display area DA. The common voltage transfer line 70 may extend substantially in the first direction x at upper and lower sides of the display area DA, and substantially in the second direction y at left and right sides of the display area DA. The common voltage transfer line 70 may be substantially symmetrical with reference to the centerline of the display panel 10 that extends in the second direction y.

A sealant 50 is disposed in the non-display area NA. In FIG. 1 and FIG. 2, shaded regions correspond to regions where the sealant 50 is disposed. The sealant 50 may completely surround the display area DA in a plan view of the display device. Edges of the sealant 50 may substantially coincide with an upper edge, a left edge, and a right edge of the second substrate 210. An edge of the sealant 50 may be disposed slightly away from (and substantially parallel to) a lower edge of the second substrate 210

If the sealant 50 reaches the lower edge, it may be difficult to cut the second substrate 210 to be shorter than the first substrate 110. The sealant 50 may bond the first substrate 110 to the second substrate 210, and may prevent impurities such as external moisture and oxygen from entering the space between the first substrate 110 and the second substrate 210. The display area DA may be substantially airtight, enclosed by the first substrate 110, the second substrate 210, and the sealant 50. In general, the sealant 50 may have a substantially rectangular shape, and may have curved corners.

The pad area PA is positioned farther from the display area DA than the sealant 50 is, and the driving voltage transfer line 60 and the common voltage transfer line 70 are connected to the pads P of the pad area PA, and thus the sealant 50 may overlap the driving voltage transfer line 60 and the common voltage transfer line 70 at least at a lower side of the display area DA.

The sealant 50 may be formed by performing the following steps: coating a sealing material on the first substrate and/or the second substrate 210, disposing the first substrate 110 and/or the second substrate 210 such that the sealing material is positioned between the first substrate 110 and the second substrate 210, and heating the sealing material by irradiating a laser to a portion of the combined structure where the sealing material is coated. The coated sealing material may be a frit, e.g., a glass frit. When the sealing material is irradiated with a laser and heated, the sealing material melts and adheres to the first substrate 110 and the second substrate 210 like an adhesive, and is cured in an adhered state to form the sealant 50 for airtight bonding of the first substrate 110 and the second substrate 210. The laser may be irradiated toward the sealing material above the second substrate 210, and may travel along the sealing material. The temperature of the heat applied to the sealing material by the laser may be at, e.g., 300° C. or higher.

When the laser is irradiated to the sealing material, a metal constituting the driving voltage transfer line 60 and/or the common voltage transfer line 70 may be melted and deformed by heat of the laser and/or a latent heat of the sealing material, so that short circuit may occur between the driving voltage transfer line 60 and the common voltage transfer line 70. Such a short circuit is likely to occur in a narrow region between the driving voltage transfer line 60 and the common voltage transfer line 70, e.g., the elongated part 61 of the driving voltage transfer line 60 and the common voltage transfer line 70. The short circuit between the driving voltage transfer line 60 and the common voltage transfer line 70 may cause a driving failure of the display panel 10. A dam 80 is disposed between the driving voltage transfer line 60 and the common voltage transfer line 70 to block a flow of the melted metal, in order to prevent a short circuit. In particular, the dam 80 may be disposed between the elongated part 61 of the driving voltage transfer line 60 and the common voltage transfer line 70. The dam 80 is spaced from each of the driving voltage transfer line 60 and the common voltage transfer line 70.

The dam 80 may extend parallel to the elongated part 61. When the elongated part 61 extends in the first direction x, the dam 80 may also extend in the first direction x. The elongated part 61 may have different widths in the second direction y, or may have a uniform y-direction width. The elongated part 61 may include a bent portion and/or a curved portion. The dam 80 may also be bent or curved, corresponding to the bent portion or the curved portion of the elongated part 61. The driving voltage transfer line 60, the common voltage transfer line 70, and the dam 80 may be formed using a same material in a same process. Thus, an additional step or the use of an additional mask to form the dam 80 is not required.

The driving unit may be disposed in the non-display area NA of the display panel 10 to generate and/or process various signals for driving the display panel 10. The driving unit may include a data driver for applying data voltages to the data lines 171, a gate driver for applying scan signals to the scan lines 121, and a signal controller for controlling the data driver and the gate driver. The pixels PX may receive data voltages at predetermined timing depending on the scan signals. The gate driver may be integrated in the display panel 10, and may be disposed on at least one side of the display area DA. The data driver and the signal controller may be provided in the integrated circuit chip 30 (also referred to as a driving IC chip 30). The integrated circuit chip 30 may be mounted on the flexible printed circuit film 20 and may be electrically connected to the display panel 10. The pad area PA may be positioned between the integrated circuit chip 30 and the display area DA.

Figure 3:
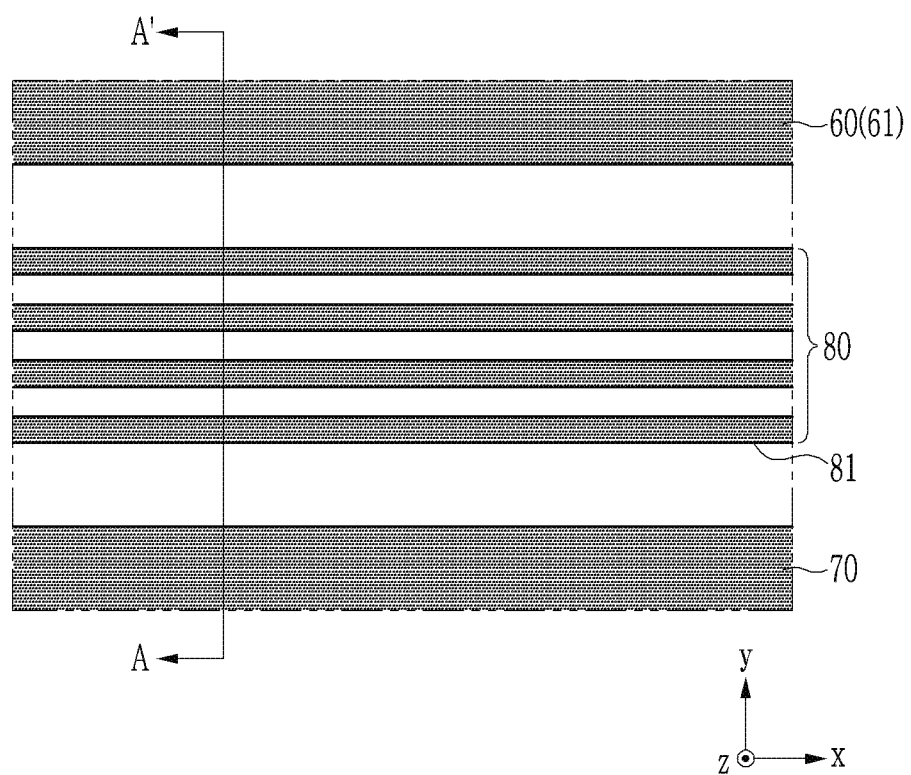
FIG. 3 illustrates a plan view of a region B shown in FIG. 2 according to an embodiment.
Figure 4:
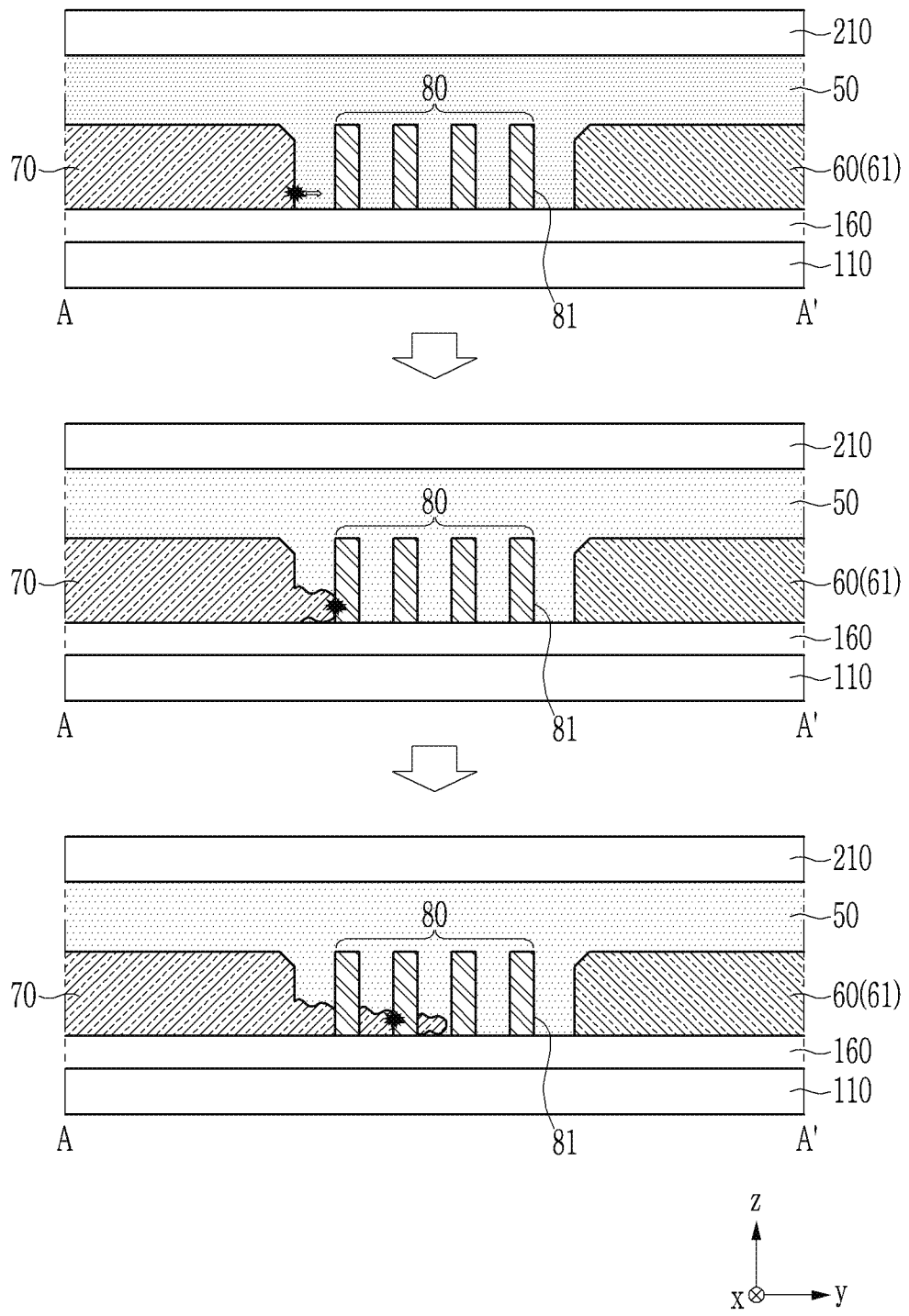
FIG. 4 illustrates cross-sectional views of a cross section taken along line A-A' of FIG. 3 according to an embodiment.
Figure 5:
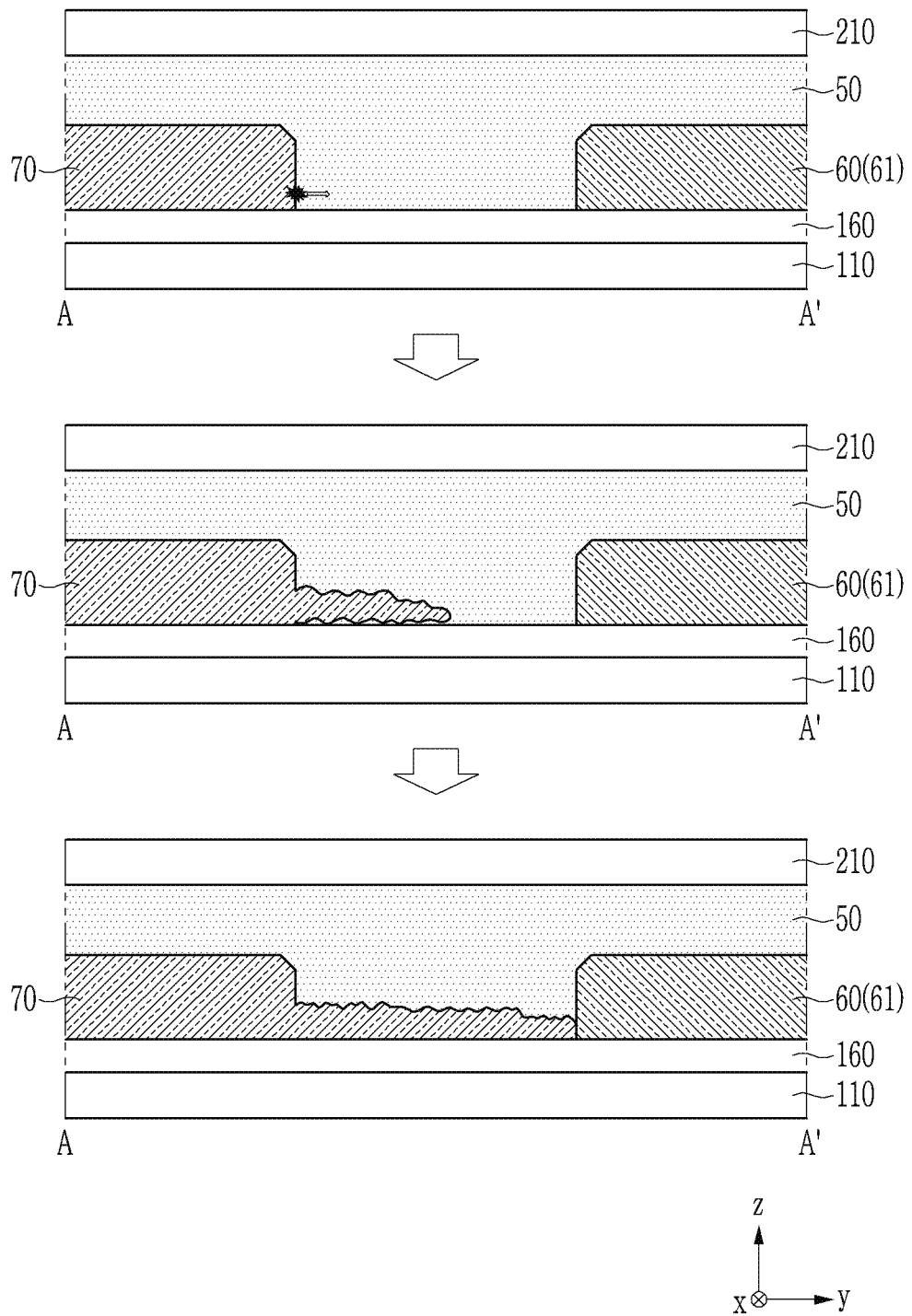
FIG. 5 illustrates cross-sectional views of a comparative example.

FIG. 3 illustrates a plan view of a region B in FIG. 2 according to an embodiment, FIG. 4 illustrates cross-sectional views taken along line A-A' of FIG. 3 according to an embodiment, and FIG. 5 is cross-sectional views of a comparative example.

The sealant 50 may substantially overlap the driving voltage transfer line 60 and the common voltage transfer line 70 and may completely overlap the dam 80 in a region illustrated in FIG. 2. The dam 80 is disposed between the driving voltage transfer line 60 (in particular, the elongated part 61) and the common voltage transfer line 70. The dam 80 (or dam set 80) may include dam members 81. Each of the dam members 81 may be substantially linear in a plan view. A length of a dam member 81 in the first direction x may be 50 times or more than a width the dam member 81 in the second direction y. The dam members 81 may be spaced apart from each other, and may extend substantially parallel to each other. A sum of widths of the dam members 81 in the second direction y may be in a range of about 30% to about 50% of a distance between the driving voltage transfer line 60 and the common voltage transfer line 70 in the second direction y. As the distance between the driving voltage transfer line 60 and the common voltage transfer line 70 increases, a number of the dam members may increase. In an embodiment, one dam member 81 may constitute the dam 80.

Referring to FIG. 4, the driving voltage transfer line 60, the common voltage transfer line 70, and the dam 80 may be disposed directly on a same insulating layer 160 formed on the first substrate 110. The driving voltage transfer line 60, the common voltage transfer line 70, and the dam 80 may be formed using a same material in a same process. For example, the driving voltage transfer line 60, the common voltage transfer line 70, and the dam 80 may be simultaneously formed by forming a metal layer on the insulating layer 160 and patterning the metal layer.

When the laser is irradiated to form the sealant 50, the metal may be melted and may deform due to a rapid temperature rise in a portion of the common voltage transfer line 70 overlapping a center of the laser. The melted metal may flow toward the driving voltage transfer line 60 but may be substantially obstructed by the dam 80 disposed between the common voltage transfer line 70 and the driving voltage transfer line 60. Even when the melted metal passes through the first dam member 81 of the dam 80, it may be blocked by the next positioned dam member 81. As a result, the melted metal does not reach the driving voltage transfer line 60.

Referring to FIG. 5, in a comparative example, no dam is disposed between the driving voltage transfer line 60 and the common voltage transfer line 70. When the metal is melted in the common voltage transfer line 70 by the laser irradiated for forming the sealant 50, the melted metal may flow toward the driving voltage transfer line 60. Since there is no structure to block the flow of the melted metal between the common voltage transfer line 70 and the driving voltage transfer line 60, the melted metal may reach the driving voltage transfer line 60 so that the common voltage transfer line 70 and the driving voltage transfer line 60 may be short-circuited. In contrast, according to an embodiment, as described with reference to FIG. 4, since the flow of the metal melted is blocked by the dam 80, no short circuit between the common voltage transfer line 70 and the driving voltage transfer line 60 may occur.

Each of FIG. 6, FIG. 7, FIG. 8, and FIG. 9 illustrates a plan view of a region corresponding to the region B in FIG. 2 according to an embodiment.

Figure 6:
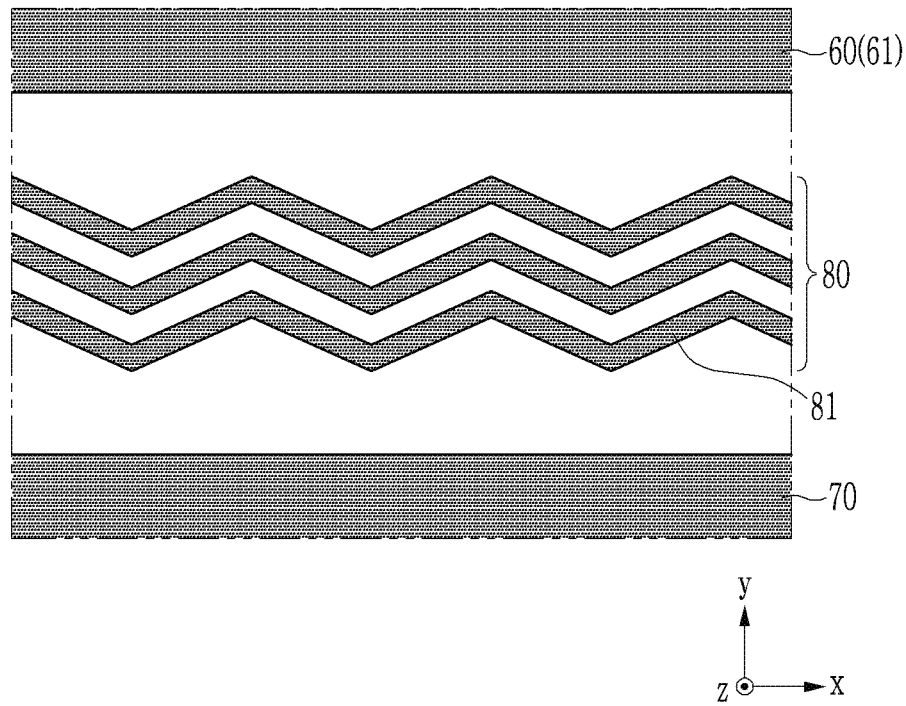

Referring to FIG. 6, each dam member 81 constituting the dam 80 may include one or more bent structures, such as a substantially W-shaped structure. The dam members 81 may include parallel sections and may be generally parallel to the elongated part 61 of the driving voltage transfer line 60. The bent structures of the dam member 81 may provide spaces for accommodating the melted metal.

Figure 7:
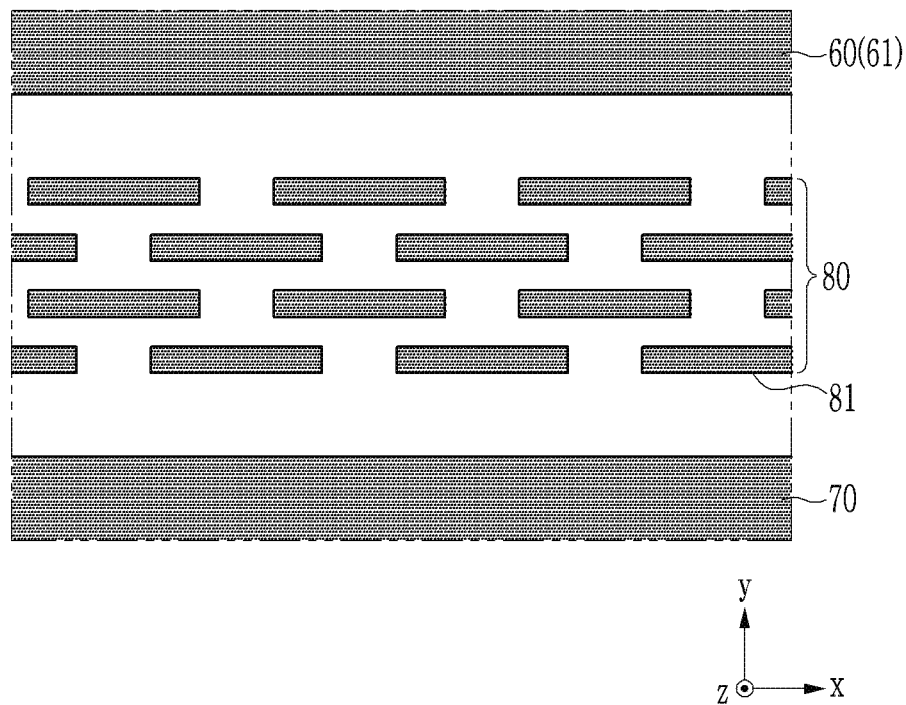
Figure 8:
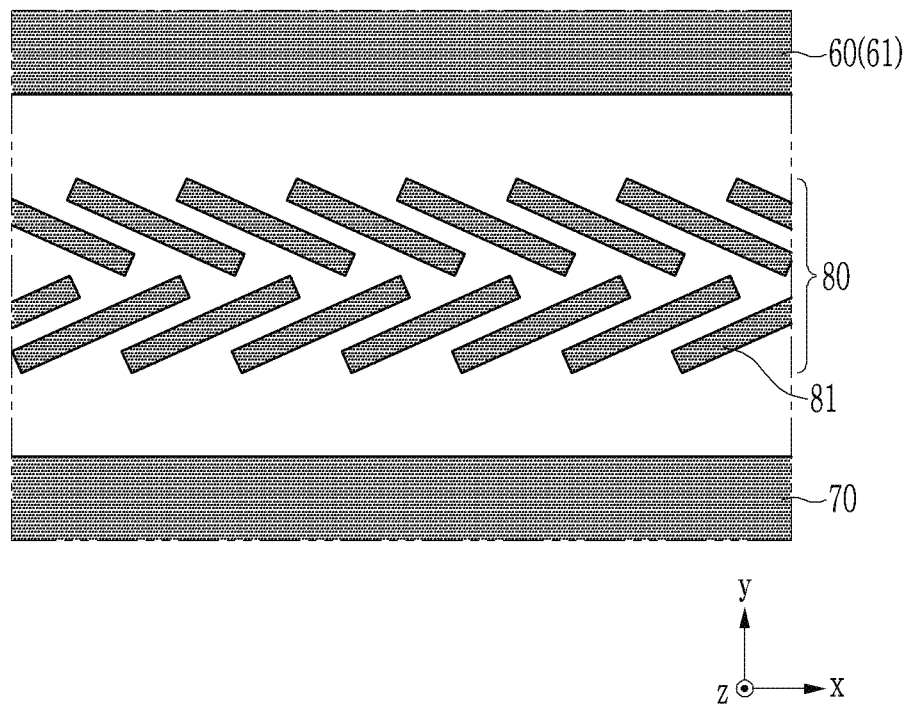
Figure 9:
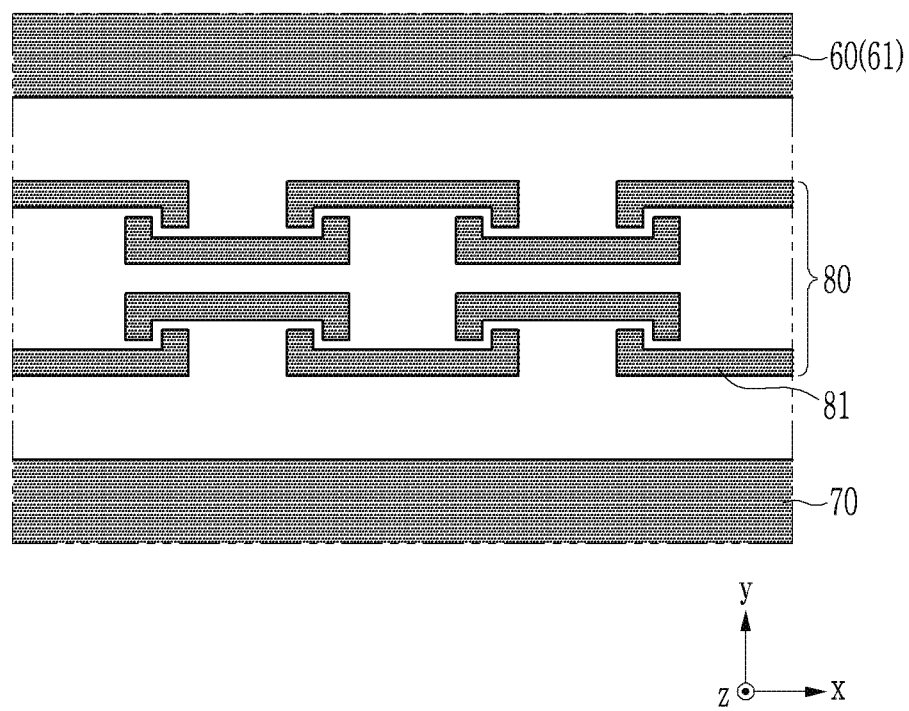
FIG. 9 illustrates a plan view of a region corresponding to the region B in FIG. 2 according to an embodiment.

Referring to FIG. 7 to FIG. 9, the dam 80 may include discrete dam members 81 arranged in the first direction x. In FIG. 7, the spaced dam members 81 are arranged in four substantially parallel rows. In FIG. 8, the dam members 81 are arranged in two rows and are oblique with respect to the elongated part 61. In FIG. 9, the dam members 81 having shapes of square brackets are arranged alternately in two or more rows. When the dam 80 has one or more of the structures described above, since the melted metal may flow between the dam members 81, a flow path of the melted metal may be maximized, and the melted metal may be substantially trapped in spaces between dam members 81, such that unwanted electrical connection may be prevented. Structures and arrangements of the dam members 81 constituting the dam 80 may be configured and combined according embodiments.

One or more dams 80 may be disposed not only between the driving voltage transfer line 60 and the common voltage transfer line 70, but also between adjacent wires overlapping the sealant 50. For example, the dam 80 may be disposed between the wires connected to the pads P of the pad area PA, such as one or more of the wires that transfer a clock signal, a light emitting frame signal, a gate high voltage, a gate low voltage, etc. to the gate driver.

Figure 10:
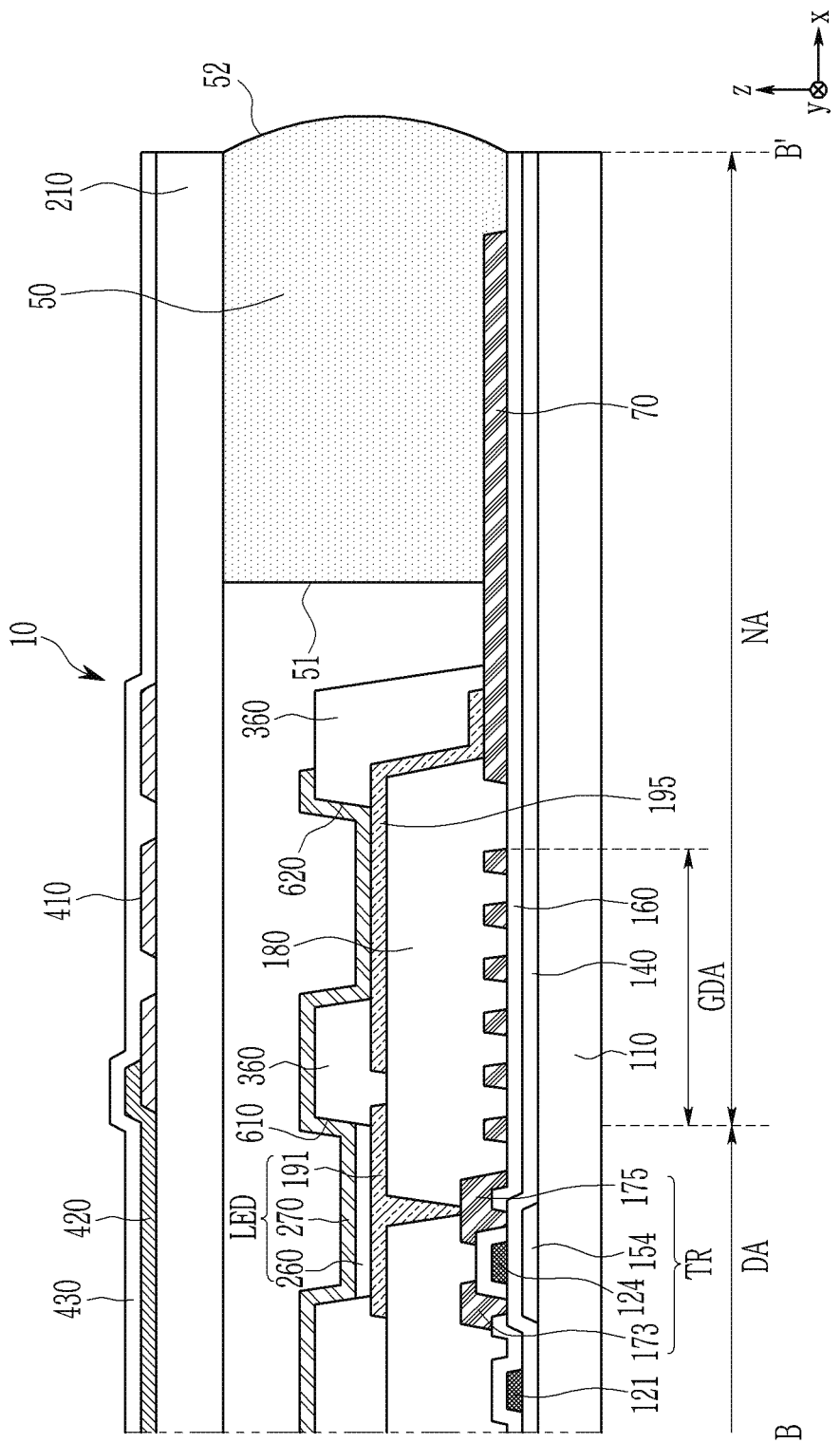
FIG. 10 illustrates a cross-sectional view taken along a line B-B' of FIG. 1 according to an embodiment.
Figure 11:
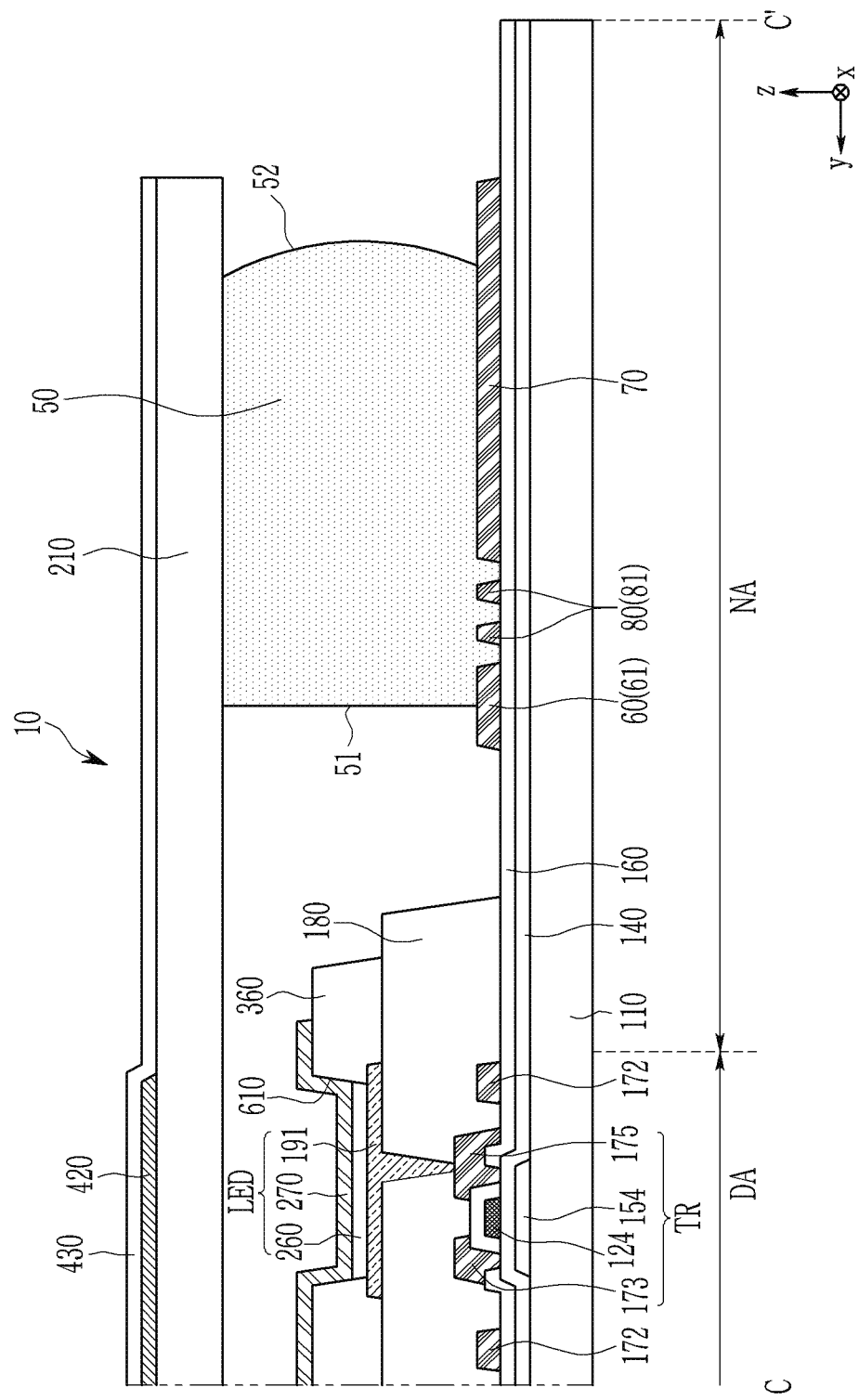
FIG. 11 illustrates a cross-sectional view taken along a line C-C' of FIG. 1 according to an embodiment.

FIG. 10 illustrates a cross-sectional view taken along a line B-B' of FIG. 1 according to an embodiment, and FIG. 11 illustrates a cross-sectional view taken along a line C-C' of FIG. 1 according to an embodiment.

Referring to FIG. 10 and FIG. 11, the first substrate 110 may be an insulation substrate made of at least one of glass, quartz, ceramic, and the like. The first substrate 110 may be optically transparent or opaque.

A semiconductor layer 154 of a transistor may be positioned on the first substrate 110. The semiconductor layer 154 may include a channel region, and a source region and a drain region positioned at opposite sides of the channel region. The semiconductor layer 154 may include polysilicon, amorphous silicon, or an oxide semiconductor.

A buffer layer may be disposed between the first substrate 110 and the semiconductor layer 154 to prevent diffusion of impurities that deteriorate characteristics of the semiconductor layer 154 and to prevent penetration of moisture or the like. A light blocking electrode may be disposed between the first substrate 110 and the semiconductor layer 154. The light blocking electrode may block external light from reaching the semiconductor layer 154 to prevent deterioration of the characteristics of the semiconductor layer 154 and to minimize a leakage current of the transistor.

A first insulating layer 140 may be disposed on the semiconductor layer 154. The first insulating layer 140 may be referred to as a gate insulating layer. The first insulating layer 140 may include an inorganic insulating material such as silicon oxide ($SiO_x$) and/or silicon nitride ($SiN_x$).

A gate conductor, which may include a gate electrode 124 of the transistor TR, the scan line 121, and the like, may be disposed on the first insulating layer 140. The gate electrode 124 may overlap a channel region of the semiconductor layer 154. The gate conductor may include a metal such as molybdenum (Mo), copper (Cu), aluminum (Al), silver (Ag), chromium (Cr), tantalum (Ta), or titanium (Ti), and may be formed as a single layer or a multilayer structure.

A second insulating layer 160, which may include an inorganic insulating material, may be disposed on the gate conductor. The second insulating layer 160 may be referred to as a gate insulating layer.

A data conductor, which includes a source electrode 173 and a drain electrode 175 of a transistor TR, the data line 171, the driving voltage line 172, the driving voltage transfer line 60, the common voltage transfer line 70, the dam 80, and the like, may be disposed on the second insulating layer 160. The data conductor can be formed by using a same material in a same process. Specifically, the source electrode 173, the drain electrode 175, the driving voltage transfer line 60, the common voltage transfer line 70, the dam 80, the data line 171, the driving voltage line 172, and the like may be formed by forming a conductive layer on the second insulating layer 160 and then patterning it through a photolithography process. The driving voltage line 172 may be electrically connected to the driving voltage transfer line 60 to receive the driving voltage ELVDD from the driving voltage transfer line 60 and apply it to the pixels PX. The driving voltage line 172 may extend from the driving voltage transfer line 60 in the second direction y.

The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, and it may be formed of a single layer or a multilayer structure (e.g., Ti/Al/Ti, Mo/Al/Mo, Mo/Cu/Mo, or the like). The driving voltage transfer line 60 and/or the common voltage transfer line 70 may be formed of a conductor disposed at a different layer from the data conductor.

The source electrode 173 and the drain electrode 175 may be connected to the source region and the drain region of the semiconductor layer 154 through an opening formed in the second insulating layer 160. The gate electrode 124, the source electrode 173, and the drain electrode 175 constitute a transistor TR together with the semiconductor layer 154. The transistor TR may be a driving transistor in the pixel PX of the emissive display device, or may be a transistor electrically connected to the driving transistor. The transistor TR may be a top-gate type in which the gate electrode 124 is positioned above the semiconductor layer 154 as illustrated, but it may be variously changed. For example, the transistor TR may be a bottom-gate transistor in which the gate electrode is disposed below the semiconductor, or may be a vertical transistor in which the source electrode and the drain electrode overlap.

A third insulating layer 180 may be disposed on the second insulating layer 160 and the gate conductor. The third insulating layer 180 may be referred to as a planarization layer, and may include an organic insulating material. The third insulating layer 180 may serve to eliminate steps and perform planarization to increase luminous efficiency of the light emitting diode display to be formed thereon. The third insulating layer 180 may include an organic insulating material. A passivation layer that may include an inorganic insulating material may be disposed between the data conductor and the third insulating layer 180. Although not specifically illustrated, in a driver area that is adjacent to the display area DA, elements (transistors, capacitors, etc.) and wires constituting a driving unit such as a gate driver may be disposed between the first substrate 110 and the third insulating layer 180.

A pixel electrode 191 and a connecting member 195 may be disposed on the third insulating layer 180. The pixel electrode 191 and the connecting member 195 may be formed by using a same material in a same process. The pixel electrode 191 may be connected to the source electrode 173 or drain electrode 175 of the transistor TR through an opening of the third insulating layer 180. The connecting member 195 may be connected to the common voltage transfer line 70. The pixel electrode 191 and the connecting member 195 may be formed of a reflective conductive material or a transflective conductive material, and may also be formed of a transparent conductive material. The pixel electrode 191 and the connection member 195 may include a transparent conductive material such as an indium tin oxide (ITO), an indium zinc oxide (IZO), lithium (Li), calcium (Ca), aluminum (Al), magnesium (Mg), and gold (Au).

A fourth insulating layer 360 may be disposed on the third insulating layer 180, the pixel electrode 191, and the connecting member 195. The fourth insulating layer 360 may be referred to as a pixel definition layer or a partition wall. The fourth insulating layer 360 may have an opening 610 exposing the pixel electrode 191. The opening 610 may define a region corresponding to an emission region of the pixel PX. The fourth insulating layer 360 may include an organic insulating material such as a polyimide, a polyacrylate, and a polyamide.

A light emitting member 260 may be disposed on the pixel electrode 191. The light emitting member 260 may include a first organic common layer, an emission layer, and a second organic common layer, which are sequentially stacked. The first organic common layer may include at least one of a hole injection layer and a hole transport layer. The emission layer may include an organic material that uniquely emits light of a primary color such as red, green, and blue, and may have a structure in which organic material layers emitting light of different colors are stacked. The first organic common layer may include at least one of an electron transport layer and an electron injection layer.

A common electrode 270 transferring the common voltage ELVSS may be disposed on the light emitting member 260. The common electrode 270 may include a transparent conductive material such as an indium tin oxide (ITO) or an indium zinc oxide (IZO). The common electrode 270 may be light-transmissive. The common electrode 270 may include a metal, such as calcium (Ca), barium (Ba), magnesium (Mg), aluminum (Al), or silver (Ag). The common electrode 270 may be connected to the connecting member 195 through an opening 620 of the fourth insulating layer 360. Since the connecting member 195 is connected to the common voltage transfer line 70, the common electrode 270 may be electrically connected to the common voltage transfer line 70 through the connecting member 195, and may receive the common voltage ELVSS from the common voltage transfer line 70. The display panel 10 may not include the connecting member 195, and the common electrode 270 may be directly connected to the common voltage transfer line 70. At least one passivation layer or functional layer may be disposed on the common electrode 270.

The pixel electrode 191, the light emitting member 260, and the common electrode 270 of each pixel PX constitute a light emitting diode LED, which may be an organic light emitting diode. The pixel electrode 191 may be an anode which is a hole injection electrode and the common electrode 270 may be a cathode which is an electron injection electrode, or vice versa. When holes and electrons are injected from the pixel electrode 191 and the common electrode 270 into the light emitting member 260, excitons formed by combining the injected holes and electrons are emitted when they fall from an excited state to a ground state.

The second substrate 210 facing the first substrate 110 may be an insulating substrate made of glass, quartz, ceramic, or the like, and may be optically transparent. The second substrate 210 may be bonded to the first substrate 110 by the sealant 50.

A touch sensor layer including a touch signal line 410 and a touch electrode 420 may be disposed on the second substrate 210. The touch sensor layer may be used to detect a user's contact and/or non-contact touch/input. The touch signal line 410 may be positioned in the non-display area NA, and the touch electrode 420 may be positioned in the display area DA. The touch signal line 410 may be formed of a metal or a metal alloy, and the touch electrode 420 may be formed of a transparent conductive material, a metal mesh, or a conductive polymer. A passivation layer 430, which is an insulating layer, may be disposed on the touch signal line 410 and the touch electrode 420. The touch electrode 420 may be disposed on the touch signal line 410 or vice versa, or the touch signal line 410 and the touch electrode 420 may be positioned at a same layer. The touch signal line 410 and the touch electrode 420 may be positioned on an inner surface of the second substrate 210 (i.e., a surface facing the first substrate 110), and may be formed on a separate substrate to be attached to the second substrate 210.

The sealant 50 for bonding the first substrate 110 and the second substrate 210 may be disposed between the first substrate 110 and the second substrate 210. The sealant 50 may include an inner surface 51 facing the display area DA and an outer surface 52 forming part of an outer surface of the display panel 10. When the display panel 10 has a substantially quadrangular shape, the inner surface 51 of the sealant 50 may have a substantially quadrangular shape in a plan view, and may be curved at four corners. The outer surface 52 of the sealant 50 may substantially coincide with edges of the first substrate 110 and the second substrate 210. The outer surface 52 of the sealant 50 may protrude beyond the edges of the first substrate 110 and second substrate 210. In this case, the edges of the first substrate 110 and second substrate 210 may not be substantially damaged by impact on the display device.

Heat applied or generated during formation of the sealant 50 may cause the common voltage transfer line 70 overlapping a center of the sealant 50 to partially melt so that the metal is melted and flows toward the driving voltage transfer line 60. Since the dam 80 is disposed between the common voltage transfer line 70 and the driving voltage transfer line 60, even when the metal is melted, it may be prevented from flowing to the driving voltage transfer line 60. Portions of the driving voltage transfer line 60, the common voltage transfer line 70, and the dam 80 which overlap the sealant 50 may contact the sealant 50 in respective regions overlapping the sealant 50.

The common voltage transfer line 70 may serve as a reflective layer that increases utilization efficiency of a laser irradiated when the sealant 50 is formed. Openings such as slits may be formed in the common voltage transfer line 70 in order to increase adhesion by increasing a contact area of a lower end portion of the sealant 50. The connecting member 195 may directly contact the common voltage transfer line 70 at a left end portion, a right end portion, and/or an upper end portion of the display panel 10.

Figure 12:
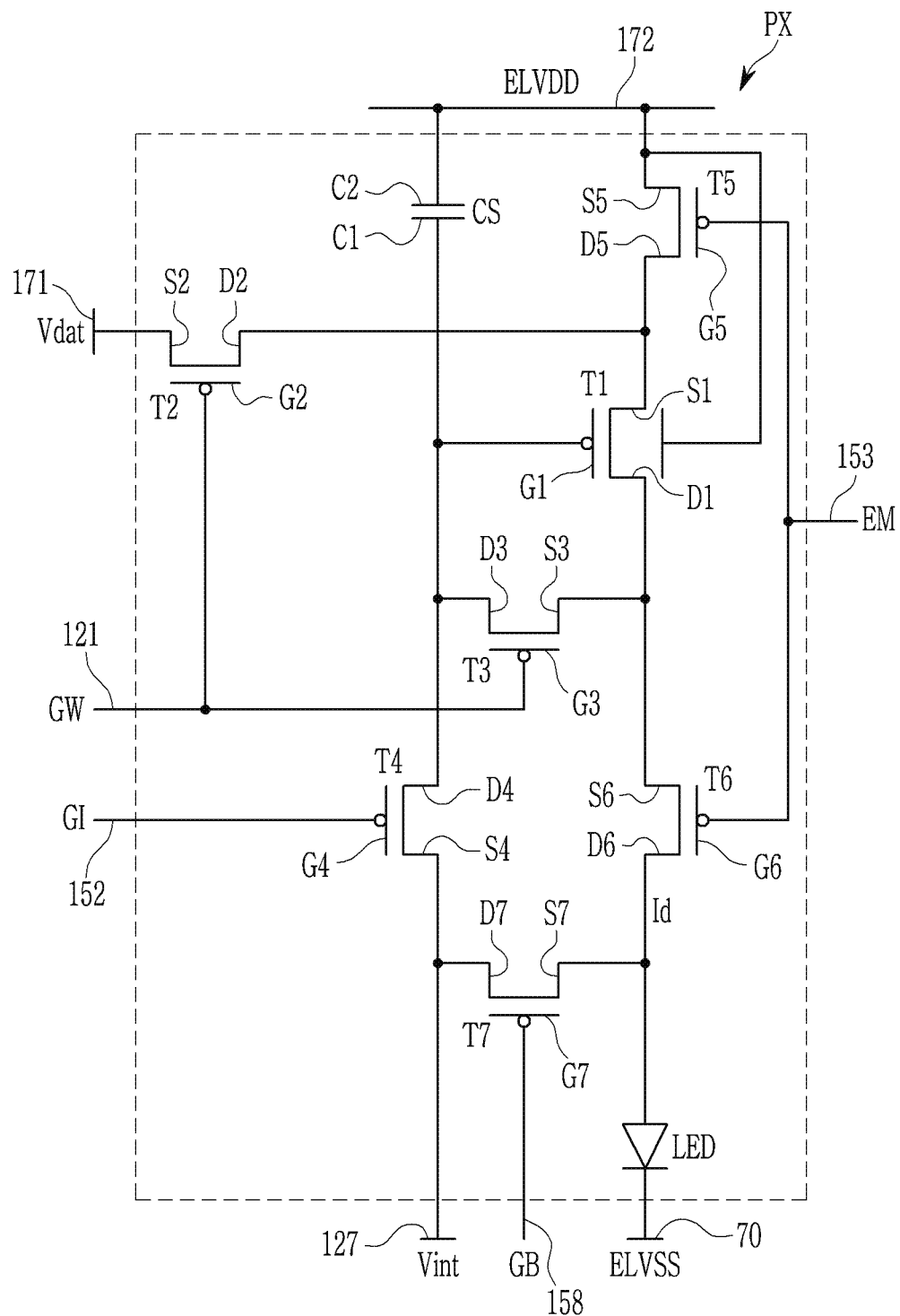
FIG. 12 illustrates an equivalent circuit diagram of a pixel of a display device according to an embodiment.

FIG. 12 illustrates an equivalent circuit diagram of a pixel of a display device according to an embodiment.

Referring to FIG. 12, the pixel PX may include transistors T1 to T7 connected to signal lines 121, 127, 152, 153, 158, 171, and 172, a storage capacitor CS, and a light emitting diode LED.

The transistors T1 to T7 include a driving transistor T1, a switching transistor T2, a compensation transistor T3, an initialization transistor T4, an operation control transistor T5, an emission control transistor T6, and a bypass transistor T7.

The signal lines 121, 127, 152, 153, 158, 171, and 172 may include a scan line 121, an initialization voltage line 127, a previous-stage scan line 152, an emission control line 153, a bypass control line 158, a data line 171, and a driving voltage line 172.

The scan line 121 may transfer a scan signal GW to the switching transistor T2 and the compensation transistor T3. The previous-stage scan line 152 may transfer a previous-stage scan signal GI to the initialization transistor T4. The light emission control line 153 may transfer the light emission control signal EM to the operation control transistor T5 and the emission control transistor T6. The bypass control line 158 may transfer a bypass signal GIn to the bypass transistor T7.

The data line 171 may receive a data voltage Vdat, and the driving voltage line 172 and the initialization voltage line 127 may receive a driving voltage ELVDD and an initialization voltage Vint, respectively. The driving voltage line 172 is connected with the aforementioned driving voltage transfer line 60. The initialization voltage Vint may initialize the driving transistor T1.

The respective transistors T1 to T7 include gate electrodes G1 to G7, source electrodes S1 to S7, and drain electrodes D1 to D7, and the storage capacitor CS includes a first electrode C1 and a second electrode C2. The electrodes of the transistors T1 to T7 and the storage capacitor CS may be connected as illustrated in FIG. 12. An anode of the light emitting diode LED, which may be an organic light emitting diode, may be connected to the drain electrode D1 of the driving transistor T1 through the emission control transistor T6. A cathode of the light emitting diode LED may be connected to the common voltage transfer line 70 that transmits the common voltage ELVSS through the above-described connecting member 195, or may be directly connected to the common voltage transfer line 70.

In a circuit structure of the pixel PX, transistors, capacitors, and related connection may be configured according to embodiments.

While example embodiments have been described, practical embodiments are not limited to the described embodiments. Practical embodiments cover various modifications and equivalent arrangements within the scope of the appended claims.

What is claimed is:

1. A display device comprising:
a first substrate;
a driving voltage transfer line disposed on the first substrate and configured to transfer a driving voltage;
a common voltage transfer line disposed on the first substrate and configured to transfer a common voltage;
a dam disposed between the driving voltage transfer line and the common voltage transfer line, electrically isolated from at least one of the driving voltage transfer line and the common voltage line, and disposed on the first substrate;
a second substrate overlapping the first substrate; and
a sealant disposed between the first substrate and the second substrate and overlapping each of the driving voltage transfer line, the common voltage transfer line, and the dam.

2. The display device of claim 1, wherein the driving voltage transfer line, the common voltage transfer line, and the dam are made of a same material.

3. The display device of claim 1, further comprising an insulating layer disposed on the first substrate, wherein each of the driving voltage transfer line, the common voltage transfer line, and the dam directly contacts the insulating layer.

4. The display device of claim 1, wherein the dam directly contacts the sealant.

5. The display device of claim 1, wherein the driving voltage transfer line includes an elongated part extending parallel to each of the dam and an edge of the sealant in a plan view of the display device.

6. The display device of claim 1, wherein the dam includes at least one dam member having a linear structure in a plan view of the display device.

7. The display device of claim 1, wherein the dam includes a W-shaped structure in a plan view of the display device.

8. The display device of claim 1, wherein the dam includes dam members that are spaced from each other in an extension direction of an edge of the driving voltage transfer line.

9. The display device of claim 1, wherein the dam is positioned between an edge of the driving voltage transfer line and an edge of the common voltage transfer line, wherein the dam includes dam members that are spaced from each other, and wherein each of the dam members is oriented oblique with respect to the edge of the driving voltage transfer line in a plan view of the display device.

10. The display device of claim 1, wherein the dam includes dam members that are spaced from each other, and wherein each of the dam members has a shape of a square bracket in a plan view of the display device.

11. A display device comprising:
a first substrate including a display area and a non-display area;
a first voltage transfer line disposed on the non-display area and configured to transfer a first voltage having a first voltage level;
a second voltage transfer line disposed on the non-display area and configured to transfer a second voltage having a second voltage level unequal to the first voltage level;
a dam disposed between the first voltage transfer line and the second voltage transfer line and electrically isolated from at least one of the first voltage transfer line and the second voltage line;
a second substrate overlapping the first substrate; and
a sealant disposed between the first substrate and the second substrate, surrounding the display area in a plan view of the display device, and overlapping each of the first voltage transfer line, the second voltage transfer line, and the dam.

12. The display device of claim 11, wherein the first voltage transfer line, the second voltage transfer line, and the dam are made of a same material.

13. The display device of claim 11, further comprising:
a pixel disposed on the first substrate and disposed in the display area;
a scan line extending in a first direction and configured for applying a scan signal to the pixel;
a data line extending in a second direction and configured for applying a data voltage to the pixel, wherein the second direction is different from the first direction; and
a driving voltage line extending in the second direction and configured for applying a driving voltage to the pixel,
wherein one of the first voltage transfer line and the second voltage transfer line is electrically connected to the driving voltage line.

14. The display device of claim 13, further comprising an insulating layer disposed on the first substrate, wherein each of the first voltage transfer line and the dam directly contacts each of the insulating layer and the sealant.

15. The display device of claim 11, wherein the first voltage transfer line transfers a driving voltage, wherein the second voltage transfer line transfers a common voltage, wherein an edge of the first voltage transfer line extends in the first direction, and wherein a lengthwise direction of the dam is in the first direction.

16. The display device of claim 11, wherein the dam includes at least one linear dam member in a plan view of the display device.

17. The display device of claim 11, wherein the dam includes a W-shaped structure in a plan view of the display device.

18. The display device of claim 11, wherein the dam is positioned between an edge of the first voltage transfer line and an edge of the second voltage transfer line, wherein the dam includes dam members that are spaced from each other in an extension direction of the edge of the first voltage transfer line.

19. The display device of claim 11, wherein the dam is positioned between an edge of the first voltage transfer line and an edge of the second voltage transfer line, wherein the dam includes dam members that are spaced from each other, and wherein each of the dam members is oriented oblique with respect to the edge of the first voltage transfer line.

20. The display device of claim 11, wherein the dam includes dam members that are spaced from each other, and wherein each of the dam members has a shape of a square bracket in a plan view of the display device.

* * * * *